United States Patent
Mizukami et al.

(10) Patent No.: US 12,268,099 B2
(45) Date of Patent: Apr. 1, 2025

(54) MAGNETORESISTIVE ELEMENT AND MAGNETIC STORAGE DEVICE

(71) Applicant: TOHOKU UNIVERSITY, Sendai (JP)

(72) Inventors: Shigemi Mizukami, Sendai (JP); Tomoki Tsuchiya, Sendai (JP); Kazuma Kunimatsu, Sendai (JP); Tomohiro Ichinose, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 572 days.

(21) Appl. No.: 17/616,085

(22) PCT Filed: Jun. 4, 2020

(86) PCT No.: PCT/JP2020/022166
§ 371 (c)(1),
(2) Date: Dec. 2, 2021

(87) PCT Pub. No.: WO2020/246553
PCT Pub. Date: Dec. 10, 2020

(65) Prior Publication Data
US 2022/0320421 A1    Oct. 6, 2022

(30) Foreign Application Priority Data

Jun. 6, 2019   (JP) .................................. 2019-105891

(51) Int. Cl.
*H10N 50/85*   (2023.01)
*H10B 61/00*   (2023.01)
(Continued)

(52) U.S. Cl.
CPC ............. *H10N 50/85* (2023.02); *H10B 61/22* (2023.02); *H10N 50/01* (2023.02); *H10N 50/10* (2023.02); *H10N 50/80* (2023.02)

(58) Field of Classification Search
CPC ........ H10N 50/85; H10N 50/80; H10N 50/01; H10N 50/10; H10B 61/22
See application file for complete search history.

(56) References Cited

U.S. PATENT DOCUMENTS

| | | | |
|---|---|---|---|
| 7,554,774 B2 * | 6/2009 | Kim ...................... | B82Y 25/00 360/324.1 |
| 7,564,661 B2 * | 7/2009 | Ide ......................... | B82Y 40/00 360/324.12 |
| 2015/0235959 A1 * | 8/2015 | Lee ................... | H01L 23/53238 257/750 |

FOREIGN PATENT DOCUMENTS

| | | |
|---|---|---|
| JP | 2005-228998 A | 8/2005 |
| JP | 2008-028362 A | 2/2008 |

(Continued)

OTHER PUBLICATIONS

Tomoya Nakatani et al., "Advanced CPP-GMR Spin Value Sensor for Narrow Reader Applications" Feb. 2018 IEEE Tractions on Magnetics, vol. 54, No. 2 (Year: 2018).*

(Continued)

*Primary Examiner* — David Vu
*Assistant Examiner* — Brandon C Fox
(74) *Attorney, Agent, or Firm* — Oliff PLC

(57) ABSTRACT

A magnetoresistive element that has a magnetic material made of an alloy having a stable bcc structure containing Co as a main component, has an excellent tunnel magnetoresistive ratio, and can be put into practical use by mass production, and a magnetic storage device using the magnetoresistive element are provided. The magnetoresistive element includes a first magnetic layer whose magnetization direction is substantially fixed, a second magnetic layer whose magnetization direction is changeable, and a non-magnetic layer arranged between the first magnetic layer and the second magnetic layer. The first magnetic layer and/or (Continued)

the second magnetic layer has an alloy having a bcc structure containing Co as a main component and Co and Mn.

16 Claims, 7 Drawing Sheets

(51) Int. Cl.
    *H10N 50/01*        (2023.01)
    *H10N 50/10*        (2023.01)
    *H10N 50/80*        (2023.01)

(56) References Cited

FOREIGN PATENT DOCUMENTS

| | | | |
|---|---|---|---|
| JP | 2010-053412 A | | 3/2010 |
| JP | 2011114151 A | * | 6/2011 |

OTHER PUBLICATIONS

Parkin et al., "Giant tunnelling magnetoresistance at room temperature with MgO (100) tunnel barriers," Nature Materials, Dec. 2004, vol. 3, pp. 862-867.

Djayaprawira et al., "230% room-temperature magnetoresistance in CoFeB/MgO/CoFeB magnetic tunnel unctions," Applied Physics Letters, 2005, vol. 86, pp. 092502-1-092502-3.

Keda et al., "Tunnel magnetoresistance of 604% at 300 K by suppression of Ta diffusion in CoFeB/MgO/CoFeB pseudo-spin-valves annealed at high temperature," Applied Physics Letters, 2008, vol. 93, pp. 082508-1-082508-3.

Zhang et al., "Large magnetoresistance in bcc Co/MgO/Co and FeCo/MgO/FeCo tunnel junctions," Physical Review B, 2004, vol. 70, pp. 172407-1-172407-4.

Yuasa et al., "Giant tunneling magnetoresistance up to 410% at room temperature in fully epitaxial Co/MgO/Co magnetic tunnel junctions with bcc Co(001) electrodes," Applied Physics Letters, 2006, vol. 89, pp. 042505-1-042505-3.

Wu et al., "Magnetic structure of Co1-xMnx alloys," Physical Review B, 2001, vol. 63, pp. 214403-1-214403-8.

Snow et al., "Enhanced moments in bcc Co1-xMnx on MgO(001)," Journal of Magnetism and Magnetic Materials, 2016, vol. 419, pp. 490-493.

Snow et al., "Large moments in bcc FexCoyMnz ternary alloy thin films," Applied Physics Letters, 2018, vol. 112, pp. 072403-1-072403-4.

Kunimatsu et al., "Fabrication of magnetic tunnel junctions with a metastable bcc Co3Mn disordered alloy as a bottom electrode," Japanese Journal of Applied Physics, 2019, vol. 58, pp. 080908-1-080908-3.

Aug. 25, 2020 International Search Report issued in International Patent Application No. PCT/JP2020/022166.

Apr. 16, 2024 Office Action issued in Japanese Patent Application No. 2021-524904.

Nakatani et al., "Advanced CPP-GMR Spin-Valve Sensors for Narrow Reader Applications", IEEE Transactions on Magnetics, vol. 54, No. 2, Feb. 2018.

* cited by examiner

MAGNETORESISTIVE ELEMENT AND MAGNETIC STORAGE DEVICE

FIELD OF THE INVENTION

The present invention relates to magnetoresistive elements and magnetic storage devices.

DESCRIPTION OF RELATED ART

In products such as magnetic sensors and non-volatile magnetoresistive memories, magnetoresistive elements that exhibit the so-called tunnel magnetoresistance (TMR) effect are often used. This magnetoresistive element has a three-layer structure in which a magnetic layer (free layer) whose magnetization direction can be changed, a non-magnetic layer (insulating layer), and a magnetic layer (reference layer or fixed layer) whose magnetization direction is substantially fixed are deposited by magnetic tunnel junction, and exhibits a TMR effect in which the electrical resistance changes depending on the magnetization direction of the free layer. The magnitude of this TMR effect is represented by the tunnel magnetoresistive ratio (TMR ratio), which indicates the rate of change of the electrical resistance of the magnetoresistive element.

Magnetoresistive elements are mainly manufactured by vapor deposition, molecular beam epitaxy, and sputtering in laboratories, but they must be mass-manufactured by sputtering for practical use. Conventionally, as a magnetoresistive element manufactured by sputtering and having excellent characteristics, magnetoresistive elements are known in which the magnetic material of the free layer and the reference layer is made of a Co—Fe—B alloy and the non-magnetic layer is made of MgO (see, for example, NPLs 1 to 3). In these magnetoresistive elements, a tunnel magnetoresistive ratio of 200% to 400% is obtained by performing an annealing at 300° C. to 400° C. after forming a film by sputtering.

In order to obtain a magnetoresistive element that exhibits a larger tunnel magnetoresistive ratio, new magnetic materials are constantly being developed, and a magnetic material made of cobalt (Co) having a bcc (body-centered cubic) structure has been proposed as one of the magnetic materials. For example, it is predicted that a tunnel magnetoresistive ratio of 10,000% or more can be obtained in calculation using cobalt (Co) having this bcc structure as the magnetic material of the free layer or the fixed layer (see, for example, NPL 4). In experiments, a tunnel magnetoresistive ratio of 410% comparable to Co—Fe—B is obtained at the room temperature (see, for example, NPL 5).

As an alloy having the bcc structure containing Co as a main component, it has been reported that a Co—Mn alloy having the bcc structure, which is a metastable phase, on a GaAs substrate or an MgO substrate by molecular beam epitaxy can be formed (see, for example, NPL 6 or 7). It has also been reported that a Co—Mn—Fe alloy having the bcc structure, which is a metastable phase, can be formed on an MgO substrate by molecular beam epitaxy (see, for example, NPL 8).

CITATION LIST

Non-Patent Literature

NPL 1: S. S. Parkin, C. Kaiser, A. Panchula, P. M. Rice, B. Hughes, M. Samant, S. H. Yang, "Giant tunnelling magnetoresistance at room temperature with MgO (100) tunnel barriers", Nat. Mater., December 2004, vol. 3, p. 862-867

NPL 2: D. D. Djayaprawira, K. Tsunekawa, M. Nagai, H. Maehara, S. Yamagata, N. Watanabe, S. Yuasa, Y. Suzuki, and K. Ando, "230% room-temperature magnetoresistance in CoFeB/MgO/CoFeB magnetic tunnel junctions", Appl. Phys. Lett., 2005. vol. 86, 092502

NPL 3: S. Ikeda, J. Hayakawa, Y. Ashizawa, Y. M. Lee, K. Miura, H. Hasegawa, M. Tsunoda, F. Matsukura, H. Ohno, "Tunnel magnetoresistance of 604% at 300 K by suppression of Ta diffusion in CoFeB/MgO/CoFeB pseudo-spin-valves annealed at high temperature", Appl. Phys. Lett., 2008, vol. 93, 082508

NPL 4: X.-G. Zhang, W. H. Butler, "Large magnetoresistance in bcc Co/MgO/Co and FeCo/MgO/FeCo tunnel junctions", Phys. Rev. B, 17 Nov. 2004, vol. 70, 172407

NPL 5: S. Yuasa, A. Fukushima, H. Kubota, Y. Suzuki, and K. Ando, "Giant tunneling magnetoresistance up to 410% at room temperature in fully epitaxial Co/MgO/Co magnetic tunnel junctions with bcc Co(001) electrodes", Appl. Phys. Lett., 2006, vol. 89, 042505

NPL 6: D. Wu, G. L. Liu, C. Jing, Y. Z. Wu, D. Loison, G. S. Dong, X. F. Jin, "Magnetic structure of $Co_{1-x}Mn_x$ alloys", Phys. Rev. B, 2001, vol. 63, 214403

NPL 7: R. J. Snow, H. Bhatkar, A. T. N'Diaye, E. Arenholz, Y. U. Idzerda, "Enhanced moments in bcc $Co_{1-x}Mn_x$ on MgO(001)", J. Magn. Magn. Mater., 1 Dec. 2016, vol. 419, p. 490-493

NPL 8: R. J. Snow, H. Bhatkar, A. T. N'Diaye, E. Arenholz, Y. U. Idzerda, "Large moments in bcc $Fe_xCo_yMn_z$ ternary alloy thin films", Appl. Phys. Lett., 2018, 112, 072403

SUMMARY OF THE INVENTION

The magnetoresistive element described in NPL 5 has an excellent tunnel magnetoresistive ratio, but the Co-film having the bcc structure constituting the free layer and the fixed layer is not a thermodynamically stable structure. Thus, it is necessary to deposit a Co film of less than 1 nanometer on a Fe thick film as a base, and there is a problem that it is difficult to put it into practical use. Further, since a Co film having the bcc structure is formed by molecular beam epitaxy and it is considered difficult to form a film with good controllability by sputtering, there is also a problem that it is difficult to put it into practical use by mass production.

Although the Co—Mn alloy having the bcc structure described in NPLs 6 to 8 has a metastable phase, it is formed by the molecular beam epitaxy and is not used as a magnetic material for a magnetoresistive element.

The present invention has been made in view of the above-described problems, and an object thereof is to provide a magnetoresistive element which has a magnetic material made of an alloy having a stable bcc structure containing Co as a main component, has an excellent tunnel magnetoresistive ratio, and can be put into practical use by mass production and to provide a magnetic storage device using the magnetoresistive element.

In order to achieve the object, a magnetoresistive element according to the present invention includes: a first magnetic layer, whose magnetization direction is substantially fixed; a second magnetic layer whose magnetization direction is changeable; and a non-magnetic layer arranged between the first magnetic layer and the second magnetic layer, wherein the first magnetic layer and/or the second magnetic layer has an alloy having a bcc structure made of a transition metal and unavoidable impurities, and the alloy having the bcc structure contains Co as a main component and the Co and Mn.

In the magnetoresistive element according to the present invention, the first magnetic layer and/or the second magnetic layer has a magnetic material made of an alloy having a bcc structure containing Co as a main component and Co and Mn. Therefore, the magnetoresistive element is stable and has an excellent tunnel magnetoresistive ratio. Further, since the first magnetic layer and/or the second magnetic layer having the alloy having the bcc structure can be formed by sputtering, it can be put into practical use by mass production.

In the magnetoresistive element according to the present invention, the alloy having the bcc structure may contain a transition metal component other than Co and Mn, but it is preferable that the alloy contains the largest amount of Co among all the components. Moreover, the unavoidable impurities contained in the alloy having the bcc structure are, for example, B, C, O, Mg, Si, Al, Cu, Zn and the like. In the magnetoresistive element according to the present invention, the alloy having the bcc structure preferably contains the Co in an amount of 50 at % or more and 90 at % or less and the Mn in an amount of 10 at % or more and 40% or less. In this case, a particularly excellent tunnel magnetoresistive ratio can be obtained. In the magnetoresistive element according to the present invention, the first magnetic layer and/or the second magnetic layer is preferably made only of an alloy having the bcc structure, but the rest other than the alloy having the bcc structure may be unavoidable impurities.

In the magnetoresistive element according to the present invention, the alloy having the bcc structure may further contain Fe as a component other than Co and Mn. In this case, an excellent tunnel magnetoresistive ratio can be obtained. Further, the alloy having the bcc structure preferably contains the Mn in an amount of 18 at % or less, or the Fe in an amount of 20 at % or less. Further, in this case, it is preferable that the Co is contained in an amount of 76 at % or less and the Fe is contained in an amount of 40 at % or less, or the Mn is contained in an amount of 12 at % or more. It is more preferable that the Co is contained in an amount of 55 at % or more and 75 at % or less, the Mn is contained in an amount of 13 at % or more and 33 at % or less, and the Fe is contained in an amount of 12 at % or more and 32 at % or less. In these cases, a better tunnel magnetoresistive ratio can be obtained.

In the magnetoresistive element according to the present invention, the non-magnetic layer may have an oxide containing at least one selected from the group consisting of Mg, Zn, Al and Ti. The non-magnetic layer may have, for example, an oxide containing oxygen and two selected from the group consisting of Mg, Zn, Al and Ti. The non-magnetic layer is, for example, insulating and may contain MgO.

The magnetoresistive element according to the present invention can be manufactured by forming the first magnetic layer, the second magnetic layer, and the non-magnetic layer by sputtering, for example. In this case, mass production can be achieved by forming each layer by sputtering.

A magnetic storage device according to the present invention includes the magnetoresistive element according to the present invention and a switch element electrically connected to the magnetoresistive element.

Since the magnetic storage device according to the present invention has the magnetoresistive element according to the present invention having an excellent tunnel magnetoresistive ratio, higher speed can be achieved.

According to the present invention, it is possible to provide a magnetoresistive element which has a magnetic material made of an alloy having a stable bcc structure containing Co as a main component, has an excellent tunnel magnetoresistive ratio, and can be put into practical use by mass production and to provide a magnetic storage device using the magnetoresistive element.

DETAILED DESCRIPTION OF THE INVENTION

Hereinafter, an embodiment of the present invention will be described with reference to the drawings and examples.

Figure 1:
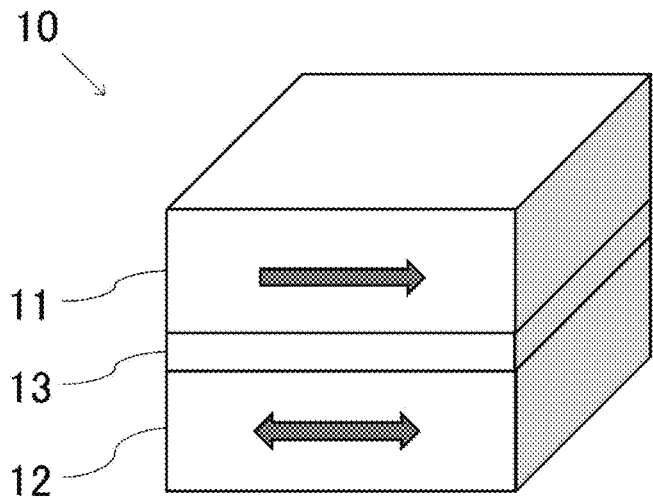
FIG. 1 is a perspective view illustrating a magnetoresistive element according to an embodiment of the present invention.

FIG. 1 illustrates a magnetoresistive element according to an embodiment of the present invention.

As illustrated in FIG. 1, a magnetoresistive element 10 has a first magnetic layer 11, a second magnetic layer 12, and a non-magnetic layer 13.

The first magnetic layer 11 has a substantially fixed magnetization direction and forms a reference layer. The second magnetic layer 12 has a changeable magnetization direction and forms a free layer. The first magnetic layer 11 and the second magnetic layer 12 are made of a magnetic material, and at least one of them is made of an alloy having a bcc (body-centered cubic) structure containing Co as a main component and Co and Mn. The alloy having the bcc structure contains Co in an amount of 50 at % or more and 90 at % or less, and Mn in an amount of 10 at % or more and 40% or less. The non-magnetic layer 13 is arranged between the first magnetic layer 11 and the second magnetic layer 12 to form an insulating layer.

In a specific example illustrated in FIG. 1, the magnetization directions (arrows in the drawing) of the first magnetic layer 11 and the second magnetic layer 12 are parallel to the surface of each layer, but may be perpendicular to the surface of each layer. Further, the first magnetic layer 11 of the reference layer and the second magnetic layer 12 of the free layer may be arranged upside down. Further, in the magnetoresistive element 10, the alloy having the bcc structure may further contain Fe in an amount of 35 at % or less.

Next, the operation will be described.

The magnetoresistive element 10 is stable and has an excellent tunnel magnetoresistive ratio since the first magnetic layer 11 and/or the second magnetic layer 12 is made of an alloy having the bcc structure containing Co as a main component and Co and Mn.

Further, the magnetoresistive element 10 can be manufactured by forming the first magnetic layer 11, the second magnetic layer 12, and the non-magnetic layer 13 by sputtering, for example. The magnetoresistive element 10 can be put into practical use by mass production by forming all layers including the first magnetic layer 11 and/or the second magnetic layer 12 having an alloy having the bcc structure by sputtering.

Example 1

Figure 2:
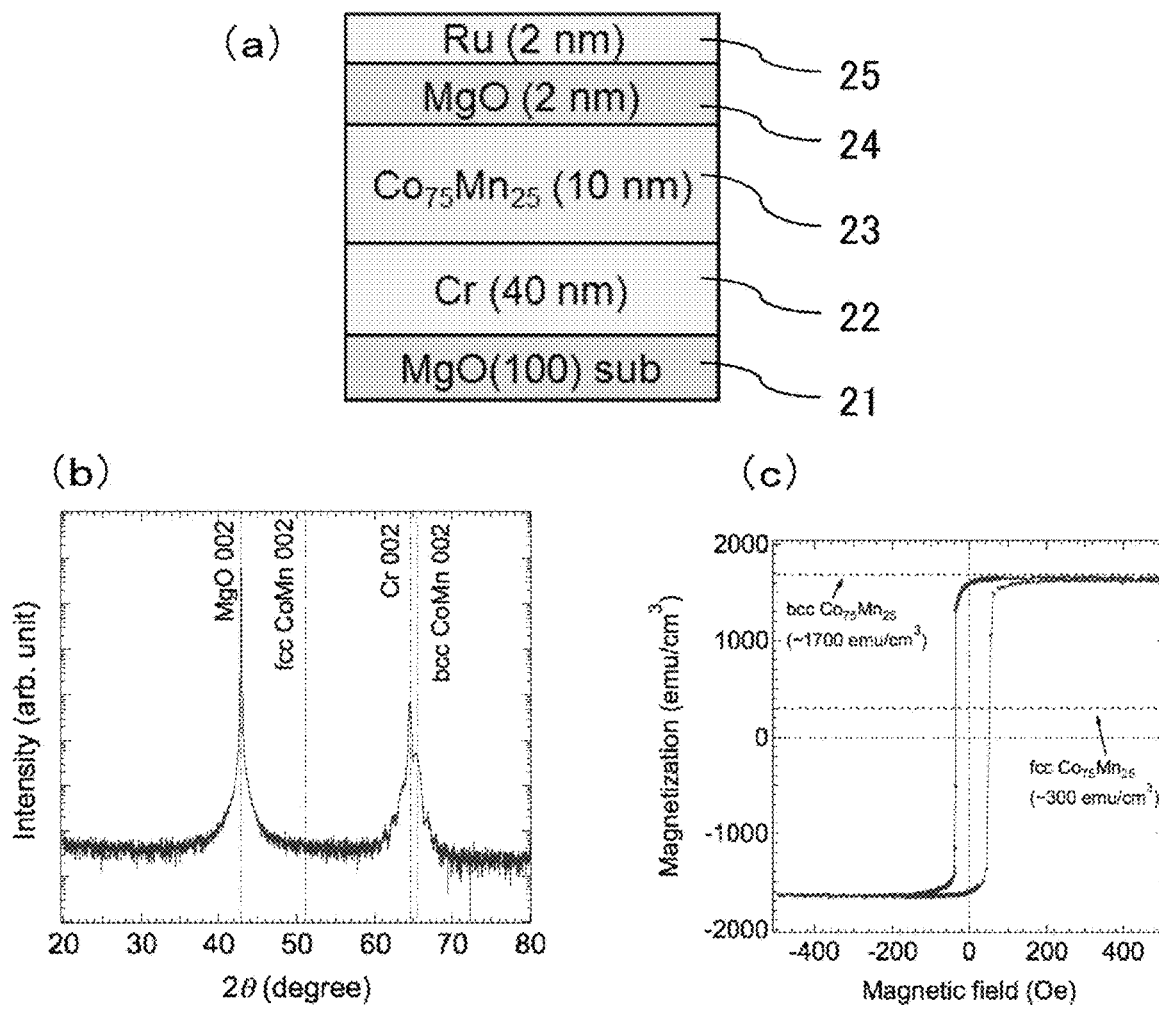
FIG. 2(a) is a vertical cross-sectional view.
FIG. 2(b) is an X-ray diffraction (XRD) spectrum.
FIG. 2(c) is a magnetization curve (M-H curve) of a test device containing a $Co_{75}Mn_{25}$ thin film made of a CoMn alloy having the bcc structure included in the magnetoresistive element according to the embodiment of the present invention.

By sputtering, a magnetic thin film made of an alloy having the bcc structure containing Co as a main component and Co and Mn was manufactured. As illustrated in FIG. 2(a), a Cr layer 22 having a thickness of 40 nm, a CoMn alloy layer 23 made of a $Co_{75}Mn_{25}$ thin film having a thickness of 10 nm, an MgO layer 24 having a thickness of 2 nm, and an Ru layer 25 having a thickness of 2 nm were sequentially formed on an MgO substrate 21 by sputtering to manufacture a test device. Using the manufactured test device, crystal structure analysis and measurement of magnetization curve (M-H curve) were performed by the X-ray diffraction (XRD) method. The results are illustrated in FIGS. 2(b) and 2(c), respectively.

As illustrated in FIG. 2(b), in the XRD spectrum, in addition to the peaks corresponding to MgO and Cr, peaks were observed at positions corresponding to CoMn in the bcc structure. In addition, no peak was observed at the position corresponding to the fcc (face-centered cubic) structure, which is a stable structure of the CoMn alloy. From this result, it is considered that the CoMn alloy layer 23 has a bcc structure.

As illustrated in FIG. 2(c), it was confirmed that the magnetization curve was non-linear and was a hysteresis curve, and the saturation magnetization $M_s$ was about 1700 $emu/cm^3$. As illustrated in the drawing, it was confirmed that since the saturation magnetization $M_s$ of the CoMn alloy having the fcc structure was 300 emu/cm3 or less, the CoMn alloy layer 23 has the bcc structure, and the saturation magnetization $M_s$ is very large.

Figure 3:
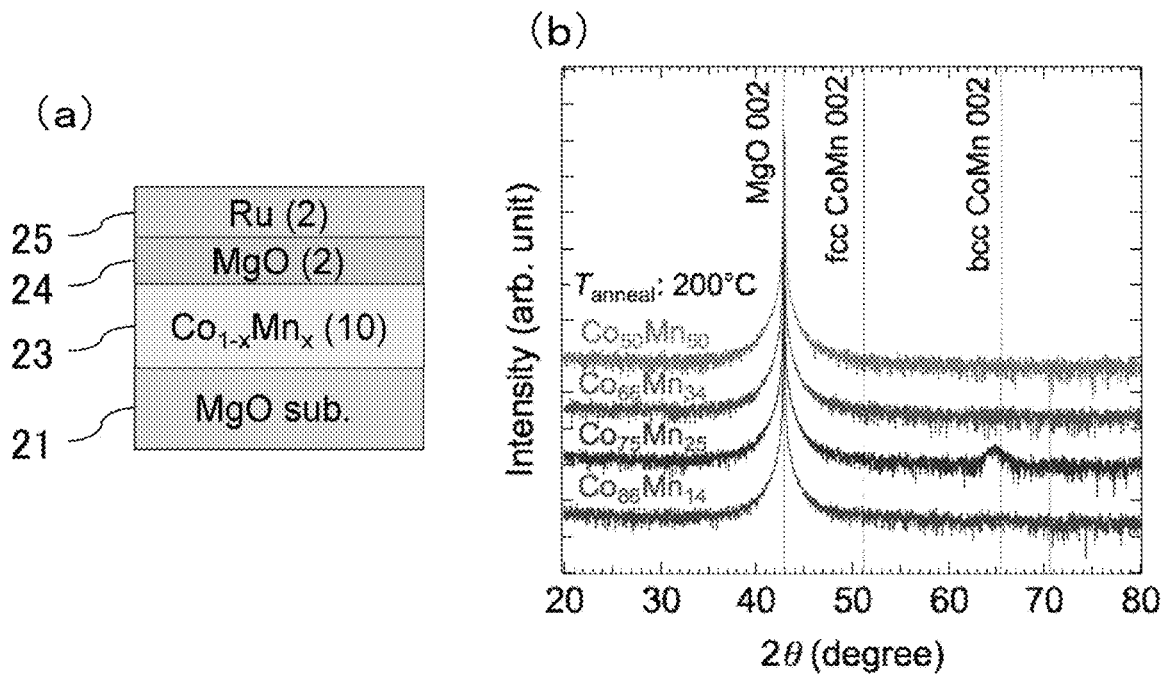
FIG. 3(a) is a vertical cross-sectional view and FIG. 3(b) is an XRD spectrum of a test device containing a $Co_{1-x}Mn_x$ thin film (x=14, 25, 34, 50) made of a CoMn alloy having the bcc structure included in the magnetoresistive element according to the embodiment of the present invention.

Subsequently, as illustrated in FIG. 3(a), a CoMn alloy layer 23 made of $Co_{1-x}Mn_x$ thin films (x=14, 25, 34, 50) having a thickness of 10 nm, an MgO layer 24 having a thickness of 2 nm, and an Ru layer 25 having a thickness of 2 nm were sequentially formed on the MgO substrate 21 by sputtering and then subjected to annealing at 200° C. for 1 hour to manufacture a test device. Using each of the manufactured test devices, crystal structure analysis and measurement of magnetization curve (M-H curve) were performed by the X-ray diffraction (XRD) method. The results are illustrated in FIGS. 3(b) and 4(a), respectively.

As illustrated in FIG. 3(b), in the XRD spectrum, a peak corresponding to MgO was observed in each test device. Further, in the test device in which the CoMn alloy layer 23 is a $Co_{75}Mn_{25}$ thin film (x=25), a peak was observed at a position corresponding to CoMn having the bcc structure, but in other test devices, a peak was not observed at that position. In addition, no peak was observed at the position corresponding to CoMn having the fcc structure in any of the test devices.

Figure 4:
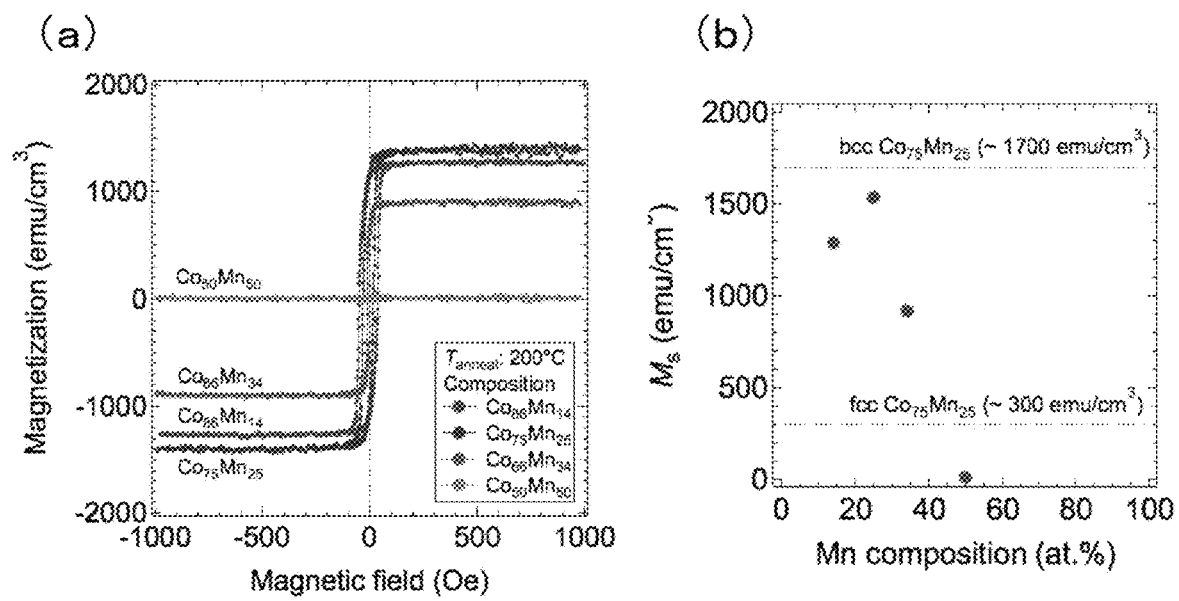
FIG. 4(a) is a magnetization curve (M-H curve) and FIG. 4(b) is a graph illustrating the relationship between saturation magnetization $M_s$ and Mn content (Mn composition) of the test device illustrated in FIG. 3 (a).

As illustrated in FIG. 4(a), it was confirmed that the magnetization curve was non-linear and was a hysteresis curve in the test device in which the CoMn alloy layer 23 is a $Co_{86}Mn_{14}$ thin film (x=14), a $Co_{75}Mn_{25}$ thin film (x=25), and a $Co_{66}Mn_{34}$ thin film (x=34), and the test device is a magnetic material. On the other hand, it was configured that in the test device in which the CoMn alloy layer 23 is a $Co_{50}Mn_{50}$ thin film (x=50), the magnetization was always zero even when a magnetic field was applied, and the test device is a non-magnetic material.

FIG. 4(b) illustrates a plot of the saturation magnetization $M_s$ of each test device obtained from the results of FIG. 4(a)

with respect to the Mn content (Mn composition). As illustrated in FIG. 4(b), it was confirmed that in the test device in which the CoMn alloy layer 23 is a $Co_{86}Mn_{14}$ thin film (x=14), a $Co_{75}Mn_{25}$ thin film (x=25), and a $Co_{66}Mn_{34}$ thin film (x=34), the saturation magnetization $M_s$ is larger than the saturation magnetization $M_s$ of 300 emu/cm³ of the CoMn alloy having the fcc structure and is smaller than the saturation magnetization $M_s$ of 1700 emu/cm³ of the CoMn alloy having the bcc structure. From this result, it is considered that the CoMn alloy layer 23 of these test devices has a bcc structure. Further, it is considered that, in the test device in which the CoMn alloy layer 23 is a $Co_{50}Mn_{50}$ thin film (x=50), since the saturation magnetization $M_s$ is smaller than the saturation magnetization $M_s$ of 300 emu/cm³ of the CoMn alloy having the fcc structure, the CoMn alloy layer 23 has an fcc structure.

Example 2

Figure 5:
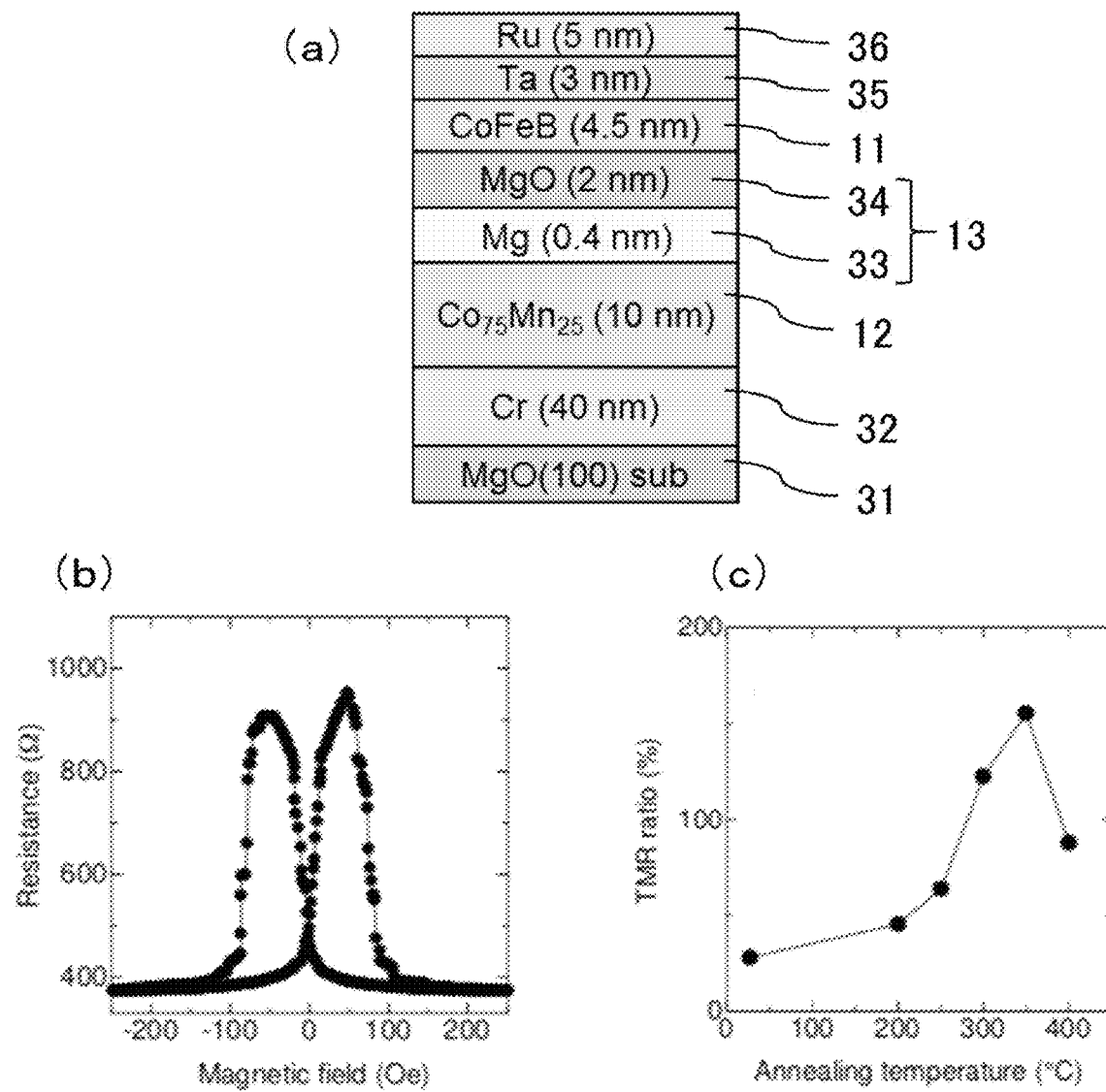
FIG. 5(a) is a vertical cross-sectional view of a test device in which both the free layer and the reference layer of the magnetoresistive element according to the embodiment of the present invention are made of a CoMn alloy having the bcc structure.
FIG. 5(b) is a graph illustrating the relationship between the tunnel resistance (Resistance) and the magnetic field (Magnetic field) when the annealing temperature is 350° C.
FIG. 5(c) is a graph illustrating the relationship between a tunnel magnetoresistive ratio (TMR ratio) and an annealing temperature.

By sputtering, a magnetoresistive element 10 in which only the free layer is made of a CoMn alloy having the bcc structure was manufactured. As illustrated in FIG. 5(a), a Cr layer (base layer) 32 having a thickness of 40 nm, a second magnetic layer 12 (free layer) made of a $Co_{75}Mn_{25}$ thin film having a thickness of 10 nm, a non-magnetic layer 13 made of an Mg film 33 having a thickness of 0.4 nm and an MgO film 34 having a thickness of 2 nm, a first magnetic layer 11 (reference layer) made of a CoFeB thin film having a thickness of 4.5 nm, a Ta layer 35 having a thickness of 3 nm, and a Ru layer 36 having a thickness of 5 nm were sequentially formed on an MgO substrate 31 by sputtering, and then subjected to annealing for 1 hour at a predetermined temperature up to 400° C. to manufacture a test device of the magnetic resistance element 10. The annealing temperature of each test device is 25° C. (without annealing), 200° C., 250° C., 300° C., 350° C., and 400° C.

The tunnel resistance was measured using each test device. The tunnel resistance was measured at room temperature by a DC 4-probe method with an applied voltage of 10 mV. The measurement results of the test device whose annealing temperature was 350° C. are illustrated in FIG. 5(b). As illustrated in FIG. 5(b), it was confirmed that an tunnel resistance-magnetic field curve corresponding to clear magnetization switching was obtained.

FIG. 5(c) illustrates a plot of the tunnel magnetoresistive ratio (TMR ratio) of each test device obtained from the measurement result of the tunnel resistance with respect to the annealing temperature. As illustrated in FIG. 5(c), it was confirmed that when only the free layer was made of a CoMn alloy having the bcc structure, a large TMR ratio of 80% or more was obtained when the annealing temperature was 300° C. to 400° C. In particular, it was confirmed that the TMR ratio was 150% or more when the annealing temperature was 350° C.

Example 3

Figure 6:
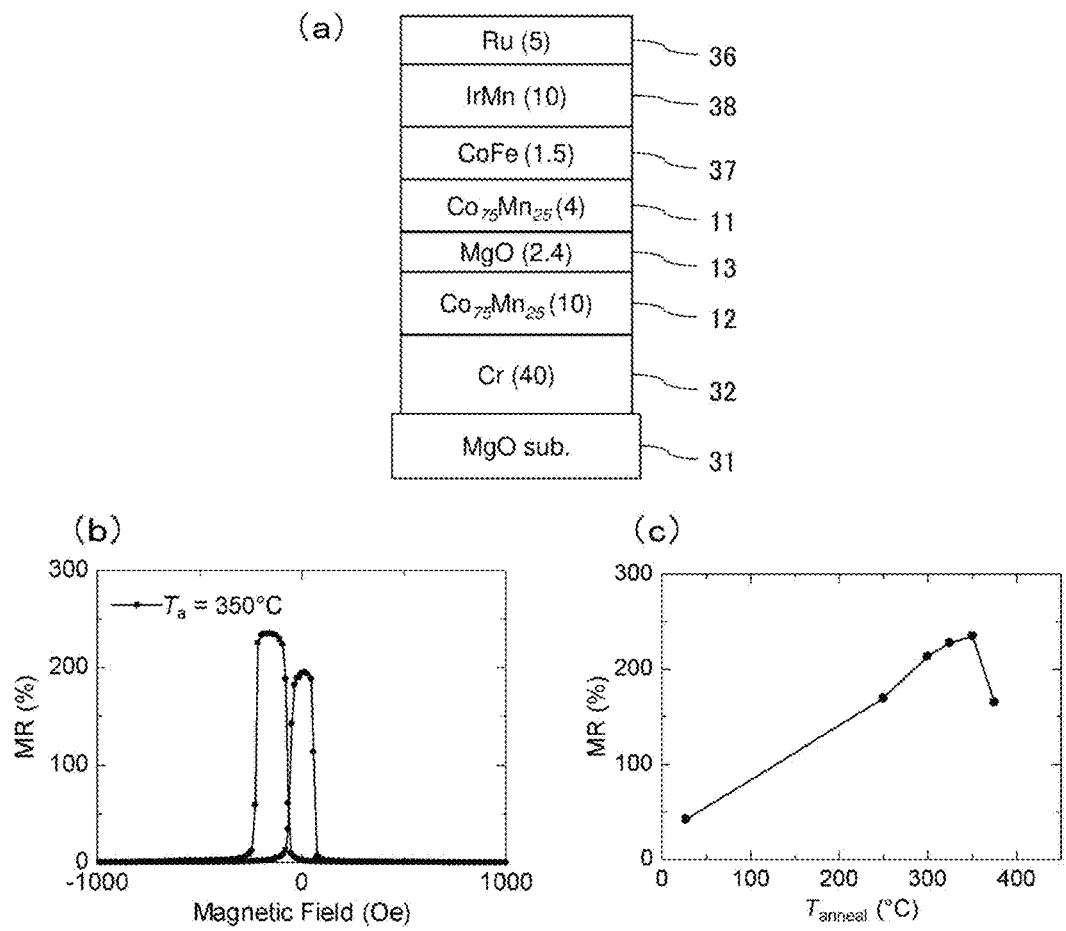
FIG. 6(a) is a vertical cross-sectional view of a test device in which only the free layer of the magnetoresistive element according to the embodiment of the present invention is made of a CoMn alloy having the bcc structure.
FIG. 6(b) is a graph illustrating the relationship between the tunnel magnetoresistive ratio (TMR ratio; MR) and the magnetic field (Magnetic field) when the annealing temperature is 350° C.
FIG. 6(c) is a graph illustrating the relationship between a tunnel magnetoresistive ratio (TMR ratio; MR) and a annealing temperature ($T_{anneal}$).

By sputtering, a magnetoresistive element 10 in which both the free layer and the reference layer were made of a CoMn alloy having the bcc structure was manufactured. As illustrated in FIG. 6A, a Cr layer (base layer) 32 having a thickness of 40 nm, a second magnetic layer 12 (free layer) made of a $Co_{75}Mn_{25}$ thin film having a thickness of 10 nm, a non-magnetic layer 13 made of an MgO film having a thickness of 2.4 nm, a first magnetic layer 11 (reference layer) made of a $Co_{75}Mn_{25}$ thin film having a thickness of 4 nm, a CoFe layer 37 having a thickness of 1.5 nm, an IrMn layer 38 having a thickness of 10 nm, and a Ru layer 36 having a thickness of 5 nm were sequentially formed on an MgO substrate 31 by sputtering, and then subjected to annealing for 1 hour at a predetermined temperature up to 375° C. to manufacture a test device of the magnetic resistance element 10. The annealing temperature of each test device is 25° C. (without annealing), 250° C., 300° C., 325° C., 350° C., and 375° C.

The tunnel resistance was measured using each test device, and the tunnel magnetoresistive ratio was obtained. The tunnel resistance was measured at room temperature by a DC 4-probe method with an applied voltage of 10 mV. FIG. 6(b) illustrates the relationship between the tunnel magnetoresistive ratio (TMR ratio; MR) and the magnetic field (Magnetic field) of the test device when annealing temperature was 350° C. As illustrated in FIG. 6(b), it was confirmed that a curve corresponding to clear magnetization switching was obtained.

FIG. 6(c) illustrates a plot of the tunnel magnetoresistive ratio (TMR ratio; MR) of each test device obtained from the measurement result of the tunnel resistance with respect to the annealing temperature ($T_{anneal}$). As illustrated in FIG. 6(c), it was confirmed that, when both the free layer and the reference layer are made of a CoMn alloy having the bcc structure, a large TMR ratio of 150% or more was obtained when the annealing temperature was 250° C. to 375° C. In particular, it was confirmed that the TMR ratio was 200% or more when the annealing temperature was 300° C. to 350° C.

Figure 7:
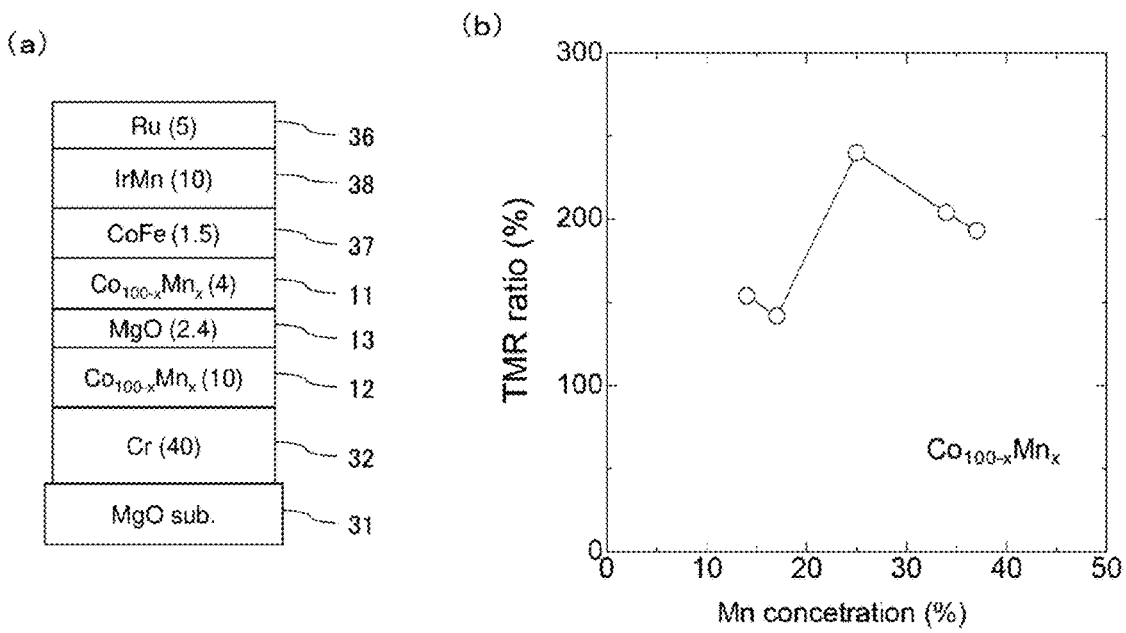
FIG. 7(a) is a vertical cross-sectional view of a test device in which the free layer and the reference layer of the magnetoresistive element according to the embodiment of the present invention are $Co_{1-x}Mn_x$ (x=14, 17, 25, 34, 37) made of a CoMn alloy having the bcc structure
FIG. 7(b) is a graph illustrating the relationship between the tunnel magnetoresistive ratio (TMR ratio) and Mn ratio x.

Subsequently, as illustrated in FIG. 7(a), a test device of the magnetoresistive element 10 was manufactured at the respective annealing temperatures while changing the composition of the CoMn alloy of the second magnetic layer 12 (free layer) and the first magnetic layer 11 (reference layer) of FIG. 6(a). The composition of each CoMn alloy was $Co_{1-x}Mn_x$ (x=14, 17, 25, 34, 37). The tunnel magnetoresistive ratio (TMR ratio) was obtained for each of the manufactured test devices in the same manner as in FIG. 6(c). FIG. 7(b) illustrates a plot of the maximum value of the TMR ratio when the annealing temperature was changed, obtained for the test devices having the same composition with respect to the composition of each test device. As illustrated in FIG. 7(b), it was confirmed that the TMR ratio was particularly large when x was about 20 or more.

Example 4

Figure 8:
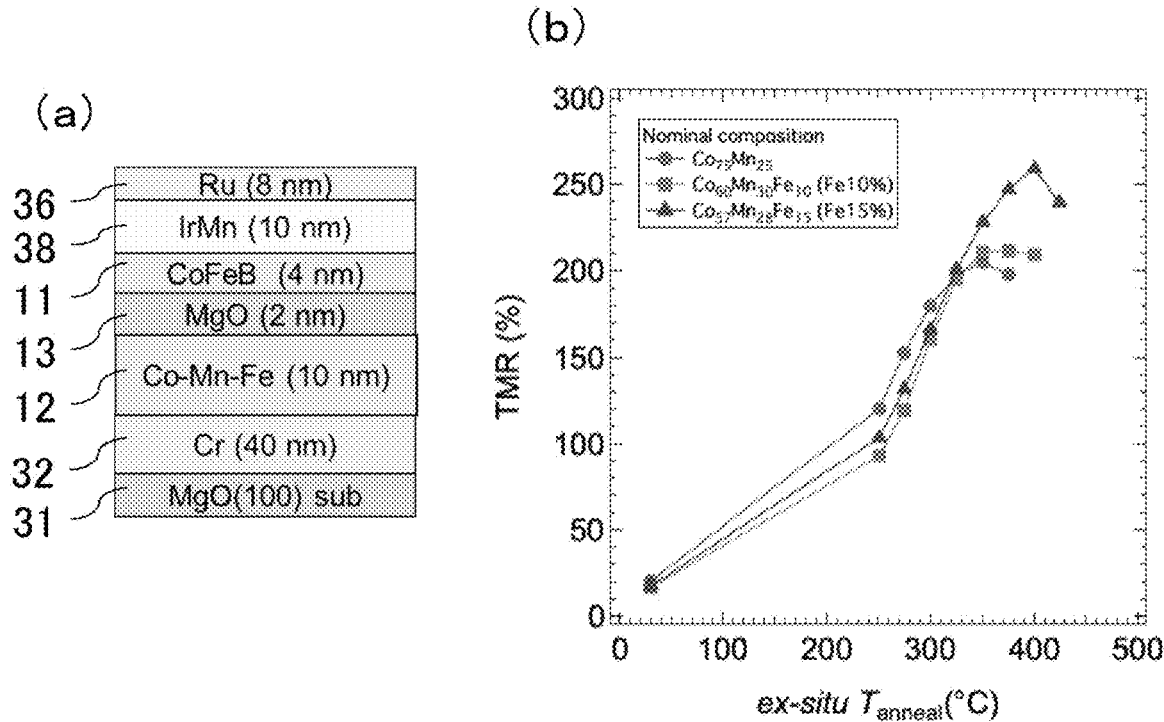
FIG. 8(a) is a vertical cross-sectional view of a test device in which only the free layer of the magnetoresistive element according to the embodiment of the present invention is made of a Co—Mn—Fe alloy having the bcc structure.
FIG. 8(b) is a graph illustrating the relationship between the tunnel magnetoresistive ratio (TMR ratio) and the annealing temperature ($T_{anneal}$).

By sputtering, a magnetoresistive element 10 having only a free layer made of a Co—Mn—Fe alloy having the bcc structure was manufactured. As illustrated in FIG. 8(a), a Cr layer (base layer) 32 having a thickness of 40 nm, a second magnetic layer 12 (free layer) made of a Co—Mn—Fe thin film having a thickness of 10 nm, a non-magnetic layer 13 made of an MgO film having a thickness of 2 nm, a first magnetic layer 11 (reference layer) made of a CoFeB thin film having a thickness of 4 nm, an IrMn layer 38 having a thickness of 10 nm, and an Ru layer 36 having a thickness of 8 nm were sequentially formed on an MgO substrate 31 by sputtering, and then subjected to annealing for 1 hour at a predetermined temperature up to 425° C. to manufacture a test device of the magnetic resistance element 10.

The second magnetic layers 12 (Co—Mn—Fe thin films) of the manufactured test devices are $Co_{60}Mn_{30}Fe_{10}$ (Fe: 10 at %) and $Co_{57}Mn_{28}Fe_{15}$ (Fe: 15 at %), respectively. Further, as a comparative example, a test device in which the second magnetic layer 12 is $Co_{75}Mn_{25}$ (Fe: 0 at %) was also manufactured. The annealing temperature of each test device is 25° C. (without annealing), 250° C., 275° C., 300° C., 325° C., 350° C., 375° C., 400° C., and 425° C.

The tunnel resistance was measured using each test device, and the tunnel magnetoresistive ratio (TMR ratio) of each test device was obtained from the measurement result. The tunnel resistance was measured at room temperature by a DC 4-terminal method with an applied voltage of 10 mV. FIG. 8(b) illustrates the relationship between the obtained TMR ratio and the annealing temperature ($T_{anneal}$). As illustrated in FIG. 8(b), it was confirmed that a large TMR ratio of 150% or more was obtained when the annealing was performed at 300° C. or higher even when Fe was contained. In particular, it was also confirmed that when the annealing was performed at 325° C. or higher, the TMR ratio was 200% or higher, and the TMR ratio was higher than that of the comparative example in which the second magnetic layer 12 did not contain Fe.

Example 5

Figure 9:
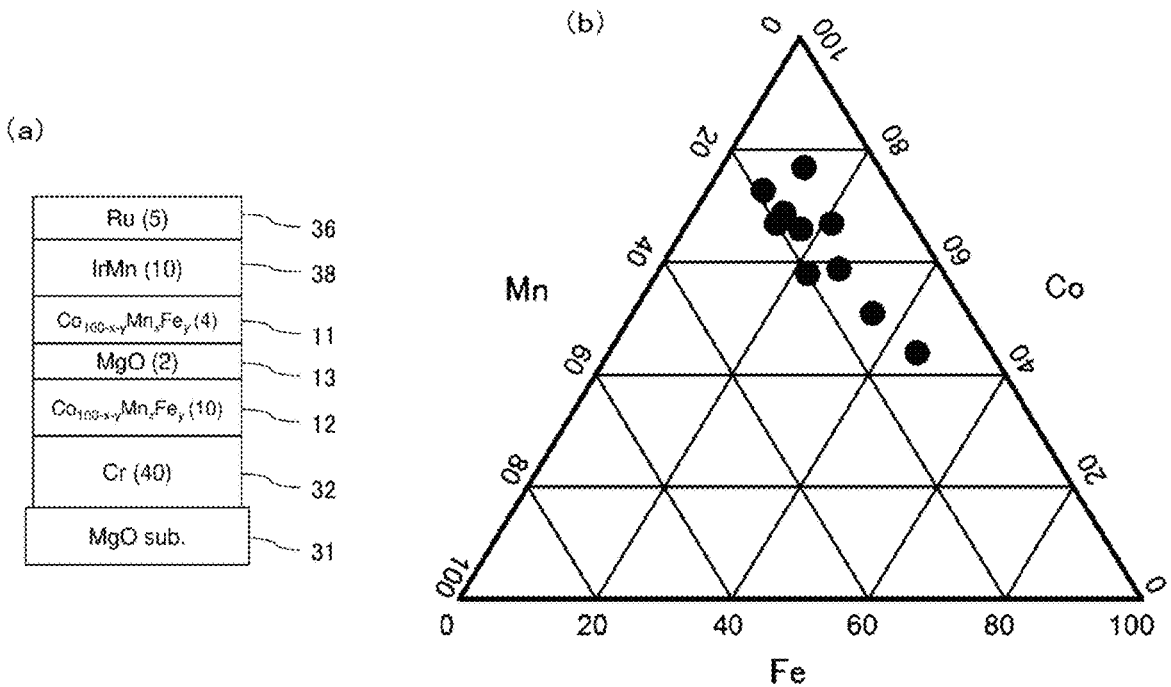
FIG. 9(a) is a vertical sectional view of a test device in which the free layer and the reference layer of the magnetoresistive element according to the embodiment of the present invention are made of a Co—Mn—Fe alloy having the bcc structure.
FIG. 9(b) is a ternary compound graph of Co, Mn, and Fe illustrating the distribution of the TMR ratio in each composition of the Co—Mn—Fe alloy.

By sputtering, a magnetoresistive element 10 in which both the free layer and the reference layer were made of a Co—Mn—Fe alloy having the bcc structure was manufactured. As illustrated in FIG. 9 (a), a Cr layer (base layer) 32 having a thickness of 40 nm, a second magnetic layer 12 (free layer) made of a Co—Mn—Fe thin film having a thickness of 10 nm, a non-magnetic layer 13 made of an MgO film having a thickness of 2 nm, a first magnetic layer 11 (reference layer) made of a Co—Mn—Fe thin film having a thickness of 4 nm, an IrMn layer 38 having a thickness of 10 nm, and an Ru layer 36 having a thickness of 5 nm were sequentially formed on a MgO substrate 31 by sputtering, and then subjected to annealing for 1 hour at a predetermined temperature up to 450° C. to manufacture a test device of the magnetic resistance element 10. As the test device, those in which the compositions of Co, Mn, and Fe of the second magnetic layer 12 and the first magnetic layer 11 were variously changed were manufactured. Further, the second magnetic layer 12 and the first magnetic layer 11 of each test device had the same composition.

Figure 10:
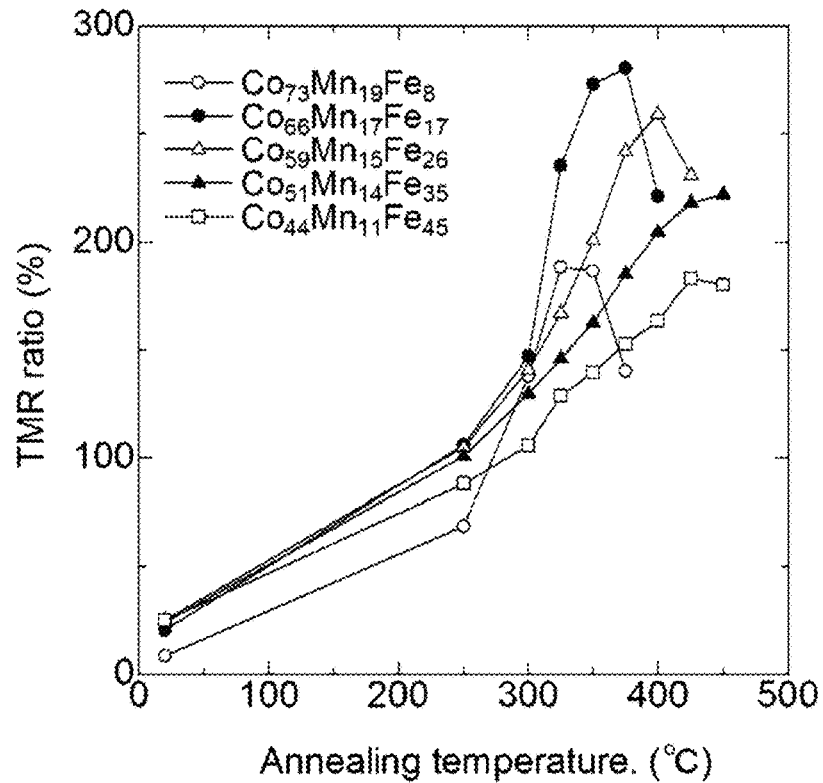
FIG. 10 is a graph illustrating the relationship between the TMR ratio and the annealing temperature when the free layer and the reference layer of the magnetoresistive element illustrated in FIG. 9 are $Co_{73}Mn_{19}Fe_8$, $Co_{66}Mn_{17}Fe_{17}$, $Co_{59}Mn_{15}Fe_{26}$, $Co_{51}Mn_{14}Fe_{35}$, and $Co_{44}Mn_{11}Fe_{45}$.
Figure 11:
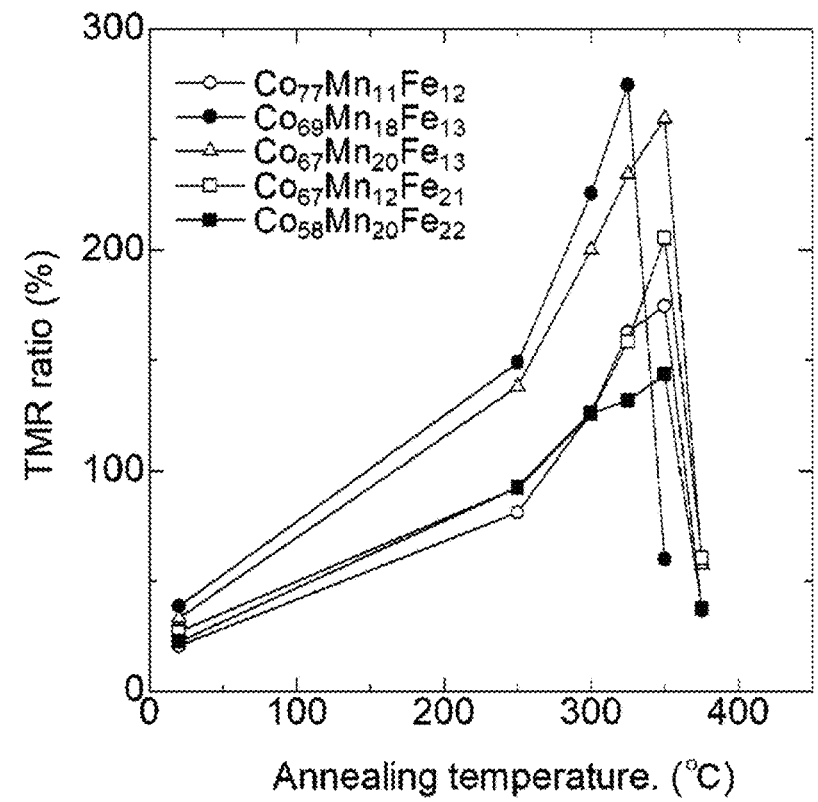
FIG. 11 is a graph illustrating the relationship between the TMR ratio and the annealing temperature when the free layer and the reference layer of the magnetoresistive element illustrated in FIG. 9 are $Co_{77}Mn_{11}Fe_{12}$, $Co_{69}Mn_{18}Fe_{13}$, $Co_{67}Mn_{20}Fe_{13}$, $Mn_{12}Co_{67}Fe_{21}$, and $Co_{58}Mn_{20}Fe_{22}$.

The tunnel resistance was measured using each test device, and the tunnel magnetoresistive ratio (TMR ratio) of each test device was obtained from the measurement result. The tunnel resistance was measured at room temperature by a DC 4-terminal method with an applied voltage of 10 mV. FIGS. 10 and 11 illustrate the relationship between the obtained TMR ratio and the annealing temperature for each test device. Further, FIG. 9(b) illustrates a plot of the maximum value of the TMR ratio of each test device obtained from FIGS. 10 and 11 on a ternary compound graph of Co, Mn, and Fe.

As illustrated in FIGS. 9 to 11, it was confirmed that the TMR ratio was 150% or more when Mn was 18 at % or less or Fe was 20 at % or less. Further, in addition to this, it was confirmed that the TMR ratio was approximately 200% or more when Co was 76 at % or less, Fe was 40 at % or less, or Mn was 12 at % or more. Further, it was confirmed that the TMR ratio was 250% or more when Co was 55 at % or more and 75 at % or less, Mn was 3 at % or more and 33 at % or less, and Fe was 12 at % or more and 32 at % or less.

Figure 12:
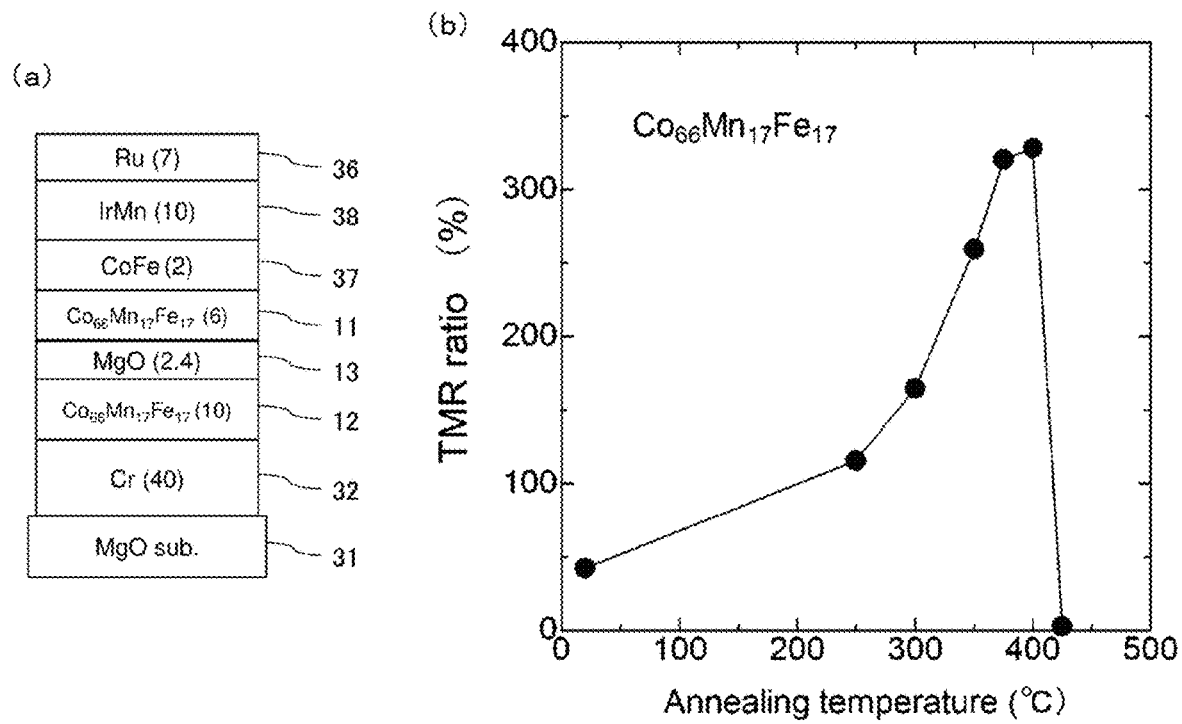
FIG. 12(a) is a vertical cross-sectional view and FIG. 12(b) is the relationship between the TMR ratio and the annealing temperature of a test device in which the free layer and the reference layer of the magnetoresistive element of the embodiment of the present invention are $Co_{66}Mn_{17}Fe_{17}$ thin films having the bcc structure.

Subsequently, with reference to the test devices illustrated in FIGS. 10 and 11 having a TMR ratio of 250% or more, a magnetoresistive element 10 illustrated in FIG. 12(a) in which the second magnetic layer 12 and the first magnetic layer 11 are made of $Co_{66}Mn_{17}Fe_{17}$ thin films was manufactured. That is, as illustrated in FIG. 12A, a Cr layer (base layer) 32 having a thickness of 40 nm, a second magnetic layer 12 made of a $Co_{66}Mn_{17}Fe_{17}$ thin film having a thickness of 10 nm, a non-magnetic layer 13 made of an MgO film having a thickness of 2.4 nm, a first magnetic layer 11 (reference layer) made of a $Co_{66}Mn_{17}Fe_{17}$ thin film having a thickness of 6 nm, a CoFe layer 37 having a thickness of 2 nm, an $IrMn_3$ layer 38 having a thickness of 10 nm, and an Ru layer 36 having a thickness of 7 nm were sequentially formed on a MgO substrate 31 by sputtering, and then subjected to annealing for 1 hour at a predetermined temperature up to 425° C. to manufacture the test device of the magnetic resistance element 10.

The tunnel resistance was measured using each test device, and the tunnel magnetoresistive ratio (TMR ratio) of each test device was obtained from the measurement result. The tunnel resistance was measured at room temperature by a DC 4-terminal method with an applied voltage of 10 mV. FIG. 12(b) illustrates the relationship between the obtained TMR ratio and the annealing temperature. As illustrated in FIG. 12(b), it was confirmed that the TMR ratio was 250% or more when the annealing was performed at 350° C. to 400° C., the TMR ratio was 300% or more when the annealing was performed at 375° C. to 400° C., and a very excellent TMR ratio was obtained.

Magnetic Storage Device According to Embodiment of Present Invention

Figure 13:
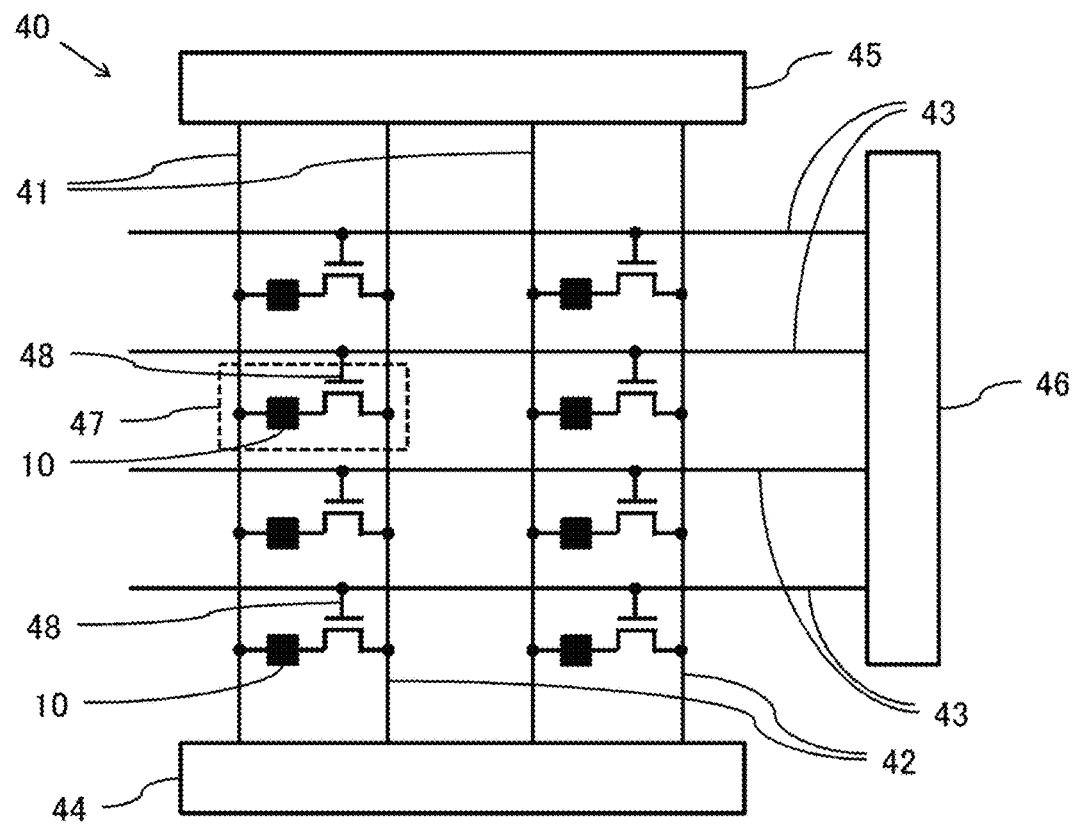
FIG. 13 is a circuit block diagram illustrating a magnetic storage device according to an embodiment of the present invention.

FIG. 13 illustrates a magnetic storage device 40 according to an embodiment of the present invention.

As illustrated in FIG. 13, the magnetic storage device 40 includes a plurality of first bit lines 41, a plurality of second bit lines 42, a plurality of word lines 43, a first circuit 44, a second circuit 45, a third circuit 46 and a plurality of memory cells 47.

The first bit lines 41 and the second bit lines 42 are arranged in parallel with each other and alternately arranged. The word lines 43 are arranged parallel to each other in a direction perpendicularly intersecting each first bit line 41 and each second bit line 42. Each of the first bit lines 41 and each second bit line 42 have one set of ends electrically connected to the first circuit 44 the other set of ends electrically connected to the second circuit 45. Each of the word lines 43 has one end electrically connected to the third circuit 46.

The first circuit 44, the second circuit 45, and the third circuit 46 each have a selection switch element, and are configured to select a plurality of wires among electrically connected wires to be able to apply a predetermined voltage. Further, each of the first circuit 44, the second circuit 45, and the third circuit 46 also has a detection circuit such as a sense amplifier.

Each memory cell 47 is arranged in a region surrounded by each first bit line 41, each second bit line 42, and each word line 43. Each memory cell 47 has a selection transistor 48 and the magnetoresistive element 10. In the selection transistor 48, the gate electrode is electrically connected to the word line 43, and the source electrode is electrically connected to the second bit line 42. In the magnetoresistive element 10, any one of the first magnetic layer 11 and the second magnetic layer 12 is electrically connected to the drain electrode of the selection transistor 48, and the other is electrically connected to the first bit line 41. Due to this, the magnetic storage device 40 is configured to be able to apply a current in the direction perpendicular to the film surface of the magnetoresistive element 10.

Next, the operation will be described.

In the operation of writing "1", a voltage is applied from the first circuit 44 or the second circuit 45 to the second bit line 42, and a voltage is applied from the third circuit 46 to the word line 43 whereby current flows from second bit line 42 to the first bit line 41 via the magnetoresistive element 10. At this time, in the magnetic resistance element 10, the magnetization direction of the second magnetic layer 12, which is a free layer whose magnetization direction is variable, and the magnetization of the first magnetic layer 11, which is a reference layer whose magnetization direction is substantially fixed, are antiparallel. Due to this, the magnetoresistive element 10 is in a high resistance state, and the information held by the magnetoresistive element 10 is "1".

On the other hand, in the operation of writing "0", a voltage is applied from the first circuit 44 or the second circuit 45 to the first bit line 41, and a voltage is applied from the third circuit 46 to the word line 43, whereby a current flows from the bit line 41 to the second bit line 42 via the magnetoresistive element 10. At this time, in the magnetoresistive element 10, the magnetization direction of the second magnetic layer 12, which is a free layer whose magnetization direction is variable, and the magnetization of the first magnetic layer 11, which is a reference layer whose magnetization direction is substantially fixed, are parallel. Due to this, the magnetoresistive element 10 is in a low resistance state, and the information held by the magnetoresistive element 10 is "0".

At the time of reading, the difference in the signal due to the resistance change is read using the detection circuits of the first circuit 44, the second circuit 45 and the third circuit 46. In this way, the magnetic storage device 40 can write and read information from the plurality of memory cells 47. The magnetic storage device 40 can be speeded up by the magnetoresistive element 10 having an excellent tunnel magnetoresistive ratio. The magnetic storage device 40 is, for example, a voltage-torque drive type magnetic memory (MRAM) or a spin injection write type MRAM.

REFERENCE SIGNS LIST

10: Magnetoresistive element
11: First magnetic layer
12: Second magnetic layer
13: Non-magnetic layer
21: MgO substrate
22: Cr layer
23: CoMn alloy layer
24: MgO layer
25: Ru layer
31: MgO substrate
32: Cr layer
33: Mg film
34: MgO film
35: Ta layer
36: Ru layer
37: CoFe layer
38: IrMn layer
40: Magnetic storage device
41: First bit line
42: Second bit line
43: Word line
44: First circuit
45: Second circuit
46: Third circuit
47: Memory cell
48: Selection transistor

What is claimed is:

1. A magnetoresistive element comprising:
a first magnetic layer, whose magnetization direction is substantially fixed;
a second magnetic layer whose magnetization direction is changeable; and
a non-magnetic layer arranged between the first magnetic layer and the second magnetic layer, wherein
the magnetoresistive element is a tunnel magnetoresistive (TMR) element, and
the first magnetic layer and/or the second magnetic layer has an alloy having a bcc structure made of a transition metal and unavoidable impurities, and the alloy having the bcc structure contains Co, Mn and Fe, wherein the Co is a main component and the Fe is in an amount of 20 at % or less.

2. The magnetoresistive element according to claim 1, wherein the alloy having the bcc structure contains the Co in an amount of 50 at % or more and less than 90 at % and the Mn in an amount of more than 10 at % and 40% or less.

3. The magnetoresistive element according to claim 2, wherein the alloy having the bcc structure contains the Mn in an amount of 18 at % or less.

4. The magnetoresistive element according to claim 3, wherein the alloy having the bcc structure contains the Co in an amount of 76 at % or less and contains the Mn in an amount of 12 at % or more.

5. A magnetic storage device comprising:
the magnetoresistive element according to claim 4; and
a switch element electrically connected to the magnetoresistive element.

6. A magnetic storage device comprising:
the magnetoresistive element according to claim 3; and
a switch element electrically connected to the magnetoresistive element.

7. The magnetoresistive element according to claim 2, wherein the alloy having the bcc structure contains the Co in an amount of 55 at % or more and 75 at % or less, the Mn in an amount of 13 at % or more and 33 at % or less, and the Fe in an amount of 12 at % or more and 20 at % or less.

8. A magnetic storage device comprising:
the magnetoresistive element according to claim 7; and
a switch element electrically connected to the magnetoresistive element.

9. A magnetic storage device comprising:
the magnetoresistive element according to claim 2; and
a switch element electrically connected to the magnetoresistive element.

10. The magnetoresistive element according to claim 1, wherein the alloy having the bcc structure contains the Mn in an amount of 18 at % or less.

11. The magnetoresistive element according to claim 10, wherein the alloy having the bcc structure contains the Co in an amount of 76 at % or less and contains the Mn in an amount of 12 at % or more.

12. A magnetic storage device comprising:
the magnetoresistive element according to claim 11; and
a switch element electrically connected to the magnetoresistive element.

13. A magnetic storage device comprising:
the magnetoresistive element according to claim 10; and
a switch element electrically connected to the magnetoresistive element.

14. The magnetoresistive element according to claim 1, wherein the alloy having the bcc structure contains the Co in an amount of 55 at % or more and 75 at % or less, the Mn in an amount of 13 at % or more and 33 at % or less, and the Fe in an amount of 12 at % or more and 20 at % or less.

15. A magnetic storage device comprising:
   the magnetoresistive element according to claim 14; and
   a switch element electrically connected to the magnetoresistive element.

16. A magnetic storage device comprising:
   the magnetoresistive element according to claim 1; and
   a switch element electrically connected to the magnetoresistive element.

* * * * *